United States Patent [19]
Brown et al.

[11] Patent Number: 5,841,236
[45] Date of Patent: Nov. 24, 1998

[54] MINIATURE PULSED VACUUM ARC PLASMA GUN AND APPARATUS FOR THIN-FILM FABRICATION

[75] Inventors: Ian G. Brown, Berkeley; Robert A. MacGill, Richmond; James E. Galvin, Emmeryville; David F. Ogletree; Miquel Salmeron, both of El Cerrito, all of Calif.

[73] Assignee: The Regents of the University of California, Oakland, Calif.

[21] Appl. No.: 326,667

[22] Filed: Sep. 14, 1994

Related U.S. Application Data

[63] Continuation-in-part of Ser. No. 773,112, Oct. 8, 1991, abandoned, which is a continuation of Ser. No. 415,616, Oct. 2, 1989, abandoned.

[51] Int. Cl.[6] .................................................. H01J 7/24
[52] U.S. Cl. .............................. 315/111.41; 315/111.21; 204/298.04; 204/298.41
[58] Field of Search .......................... 315/111.41, 111.21, 315/111.81; 313/231.31; 204/298.04, 298.41, 192.38, 192.11, 298.02

[56] References Cited

U.S. PATENT DOCUMENTS

| | | | |
|---|---|---|---|
| 4,620,913 | 11/1986 | Bergman | 204/192 R |
| 4,707,637 | 11/1987 | Harvey | 315/111.81 |
| 4,713,585 | 12/1987 | Ohno et al. | 315/111.81 |
| 4,714,860 | 12/1987 | Brown et al. | 315/111.81 |
| 4,716,340 | 12/1987 | Lee et al. | 315/111.41 |
| 4,785,220 | 11/1988 | Brown et al. | 315/111.81 |
| 4,950,956 | 8/1990 | Asamaki et al. | 315/111.21 |

*Primary Examiner*—Benny Lee
*Assistant Examiner*—Haissa Philogene
*Attorney, Agent, or Firm*—Paul Martin; Henry P. Sartorio

[57] ABSTRACT

A miniature (dime-size in cross-section) vapor vacuum arc plasma gun is described for use in an apparatus to produce thin films. Any conductive material can be layered as a film on virtually any substrate. Because the entire apparatus can easily be contained in a small vacuum chamber, multiple dissimilar layers can be applied without risk of additional contamination. The invention has special applications in semiconductor manufacturing.

23 Claims, 4 Drawing Sheets

MINIATURE PULSED VACUUM ARC PLASMA GUN AND APPARATUS FOR THIN-FILM FABRICATION

This case is a continuation in part from Ser. No. 07/773,112 as filed Oct. 8, 1991 now abandoned which is a continuation from Ser. No. 07/415,616 filed Oct. 2nd, 1989, now abandoned and is related to U.S. Pat. No. 5,013,578 filed Dec. 11, 1989 and issued May 7th, 1991.

This invention was made with Government support under Contract No. DEAC03-76SF00098 between the U.S. Department of Energy and the University of California for the operation of Lawrence Berkeley Laboratory. The Government has certain rights in this invention.

BACKGROUND OF THE INVENTION

The present invention relates to vapor deposition as a method of thin film formation. The technology for the production of thin films and compositionally modulated multilayer structures has made many advances. Multiple techniques for thin film formation have been developed, including sputtering, electron beam evaporation, molecular beam epitaxy, and laser ablation deposition. Additionally, there have been a number of research efforts geared to new methods to achieve the deposition of metallic thin films. These materials can be deposited singly, or in a multilayered structure by themselves or with other metals or non-metallic materials. Virtually all of these prior art techniques for thin film fabrication require large apparatuses which are cumbersome and expensive to operate.

Thin films are useful in both scientific research and commercial applications. For example, thin films may be used in such applications as epitaxy, integrated circuit fabrication, x-ray optics, magnetic recording media, mechanical property studies, etc. The term "thin film" is understood by practitioners of this art to mean a solid material film of about $1\mu$ or less in thickness which has been formed on a substrate material. The film material is generally different from the substrate material upon which it is deposited. The production of metallic thin films constitute a large portion of existing thin film applications.

Vacuum arc plasma sources are industrial devices for the deposition of thick metallic coatings. The metal vapor vacuum arc is a kind of plasma discharge that takes place between metallic electrodes in a high vacuum environment. These apparatuses are prolific producers of dense metal plasmas. The vacuum arc plasma sources produce intense fluxes of highly ionized metal plasma which, when condensed, form highly adherent and dense coatings.

The vacuum arc is commonly also called a "cathodic arc". Cathodic arc facilities require large pieces of equipment and are designed to apply metallic coatings to large substrate areas. The titanium nitriding of cutting tools and other components in a large batch processing mode is a typical application of this technology.

The metal vapor vacuum arc plasma discharge has been used widely for deposition of various metal coatings in a vacuum environment, and for the formation of TiN protective coatings. These industrial arc source deposition equipment types are readily available on the market.

Some of the present inventors have developed miniature high current metal ion sources for use in research type applications. These sources use ion beam extractors to produce ions from a plasma source (U.S. Pat. Nos. 4,714,860 and 4,785,220 to Brown et al, and Godechot et al). This work describes metal vapor vacuum arc ion sources including relatively large ion extracting components. Among other applications, these devices can be used to implant ions into surfaces of objects. Such metal vapor vacuum sources require ion beam extraction from a plasma before implantation into a target can be accomplished.

It would be highly desirable to have simple, miniaturized plasma guns which could be used to produce thin film layers. Ideally, they would be sufficiently miniaturized that multiple plasma guns could be simultaneously situated in a small vacuum housing, allowing repeated layering of dissimilar materials without the necessity of breaking the vacuum seal.

It was through a unique application of experience obtained in the disparate art areas of subatomic physics research and large-scale industrial production that the present inventors conceived of the inventive apparatus and process to provide finely controlled thin films using miniaturized plasma guns. Some aspects of this work are discussed in their publication "Thin Film Synthesis Using Miniature Pulsed Metal Vapor Vacuum Arc Plasma Guns", *Materials Research Society Symposium Proceedings*, Vol 190, pp 95–100, Apr. 5th, 1991.

SUMMARY OF THE INVENTION

The present inventive miniature pulsed vapor vacuum arc plasma guns represent a substantial advance over prior art apparatuses and techniques for thin film deposition. The present invention is a vacuum arc plasma source whose specialized inventive design allows miniaturization and pulsed mode operation. Any solid electrically conductive material can be deposited as a thin film. These inventive features provide for many advantages over prior art methods, and unique capacities for thin film synthesis. Prior to the present invention, thin film production was not possible using previous vapor arc ion sources for thin films in the thickness range less than about 100 Å.

The inventive apparatus provides for a miniature source with fine control over the deposition flux. This new advancement allows the formation of thin films and multilayers over relatively small areas, as well as thin applications to larger areas. Such complete control over the process is achieved by this inventive apparatus that the thickness and composition of the films produced can be tailored down to the monolayer ($\mu$-Å) level. The inventive method is strikingly simple and inexpensive, and allows the production of many samples which can be manufactured with any of many subtle variations in minimal set-up time and requiring a very small consumption of material.

It is an object of the present invention to provide miniaturized vacuum arc plasma guns.

It is a further object of this invention to provide a miniature plasma gun in an apparatus capable of providing high-quality thin film layers.

It is yet a further object of this invention to provide an simple and inexpensive method of creating thin films on a substrate.

It is an additional object of this invention to produce unique materials and thin-film constructs.

It is another object of this invention to produce sequential layers without breaking a surrounding vacuum.

It is yet another object of this invention to allow the inclusion of two or more plasma guns within a vacuum chamber.

It is a further object of this invention to allow the creation of high-quality thin films.

GENERAL DESCRIPTION OF THE INVENTION

Figure 1:
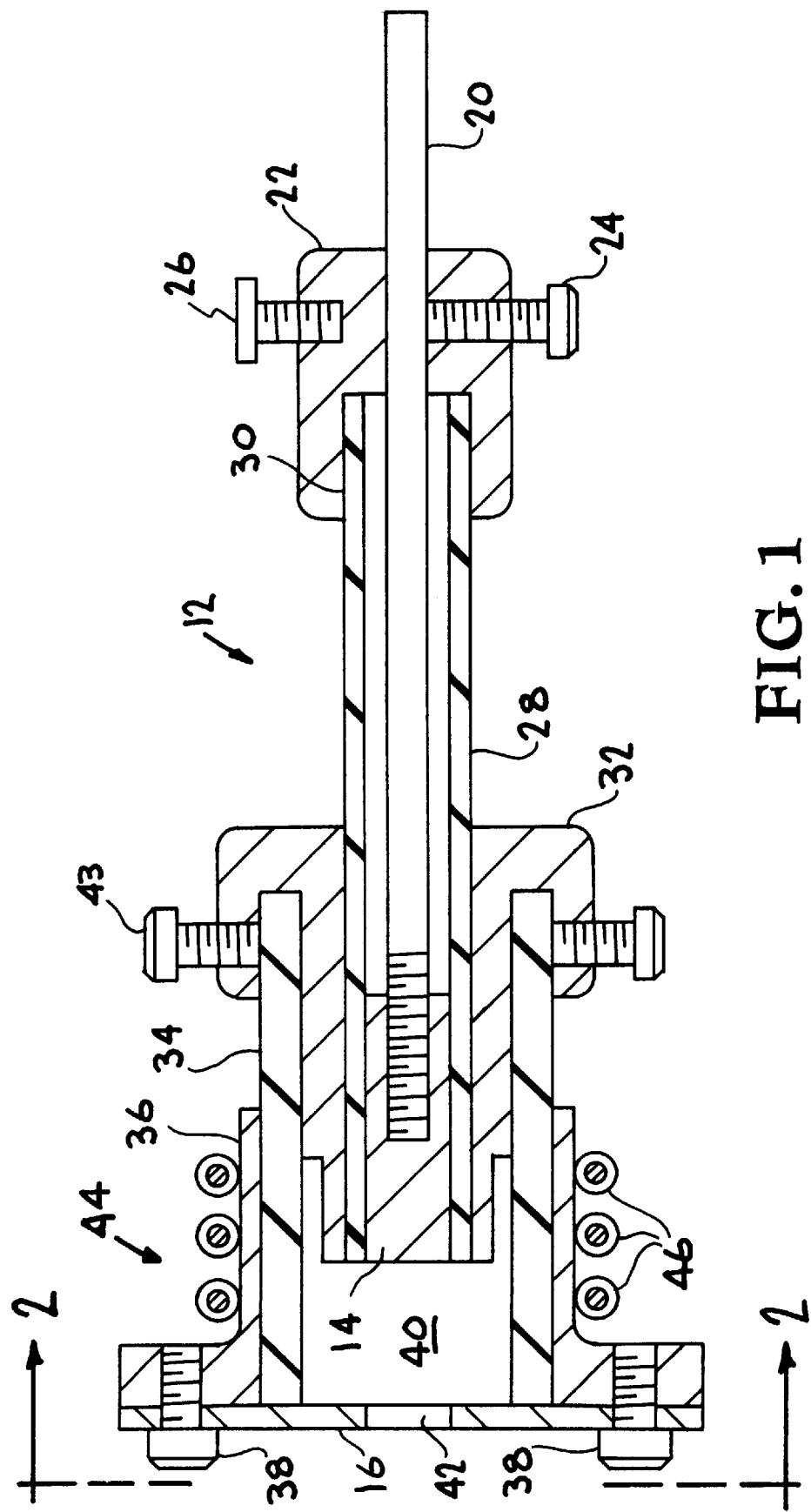
FIG. 1 is a sectional view of a plasma beam generator usable with the device of the present invention.

The present invention is a miniature pulsed vacuum arc plasma gun. This invention constitutes a dramatic advance in arc plasma apparatus previously available for producing layers. Very high quality thin films can now be produced by the inventive device, which were unattainable using the prior art apparatuses. Prior art cathodic arc devices were of necessity of a very large size, that is taking up a large portion of a small room. The present mini-pulsed plasma guns typically achieve the diameter of a U.S. dime, with the entire deposition device being about the size of a shoe box.

The inventive space-saving plasma gun can be used to deposit thin films, including multi-layer thin films, on virtually any substrate. Electrically conductive coatings of controlled thickness (Å to $\mu$) can be fabricated directly on a substrate using the plasma generated by the inventive miniature plasma gun. The plasma discharge takes place between electrodes in a high vacuum environment and is a prolific producer of dense plasma. The miniature plasma gun operates in a pulse mode, providing precise control over the plasma flux and deposition rate.

As can be seen from the examples below, the inventive plasma gun and its attendant apparatus can be made in a wide variety of sizes and configurations. It should be noted that the cathode-trigger insulated interface must be well fitted in order to provide proper function of the aspect of the invention embodied in the examples below.

Advantages

Because of its small size, the inventive plasma gun offers exceptional operational flexibility. Unlike current methods, this new technology is simple, clean, and compatible with a wide range of materials that are difficult to form into thin films, such as tungsten, molybdenum, and others. Layers of different materials can be deposited in a single run. There is no need to break vacuum or clean between layers of dissimilar materials.

The inventive plasma gun can be manufactured as a new and self-contained thin film fabrication device, as is described in the present claims. Alternatively, it can be used as a retrofit to existing thin film fabrication devices.

Excellent adhesion of layers to the substrate and to one another is a hallmark of the present invention. Lack of adhesion is a chronic problem of prior art thin-film fabrication methods. The already excellent adhesion provided by the present invention can be increased by pre-treatment of a substrate using the method of sister case U.S. Pat. No. 5,013,578. It will be appreciated that a hybrid device and method can be easily configured to allow such treatment on a continuous bases.

The inventive plasma gun deposits thin films of conductive materials in a highly controllable fashion on most substrates. Its small size makes it highly useful in confined spaces. Furthermore, the inventive apparatus is easy to locate and position, and can work in any orientation. This makes the present invention particularly useful in robotics applications. As an example, a robot arm could be used to direct the plasma spray in the manner of present spray-painting robotics. Because of the inventive plasma gun's small size, a number of guns can be clustered together for more complex operational processes.

The inventive pulsed plasma technique is much less expensive to operate than current coating systems which are run from hot sources, and therefore must be brought to room pressure and cleaned between depositions of different materials. Cold operation allows material deposition to be cleaner and more pure than with current methods. There are no outgassing problems with the present invention. Additionally, it is UHV compatible.

Applications

The materials produced using the present invention have multiple, diverse applications. Many machinery components which need to be protected against wear or corrosive environmental conditions will benefit by the availability of this technology. For instance, gears, bearings, and sliders are amenable to coating using the present method. In instances where high chemical and physical quality, low-friction surfaces are vital, the present invention has special applicability. Such applications include medical materials, such as joint prostheses and ocular lenses.

While the present invention is useful in producing coatings for small, precision parts, it is also useful in coating large components. By example, precision protective layers can be provided for parts with automobile, marine, aerospace, and building material applications. The present invention finds special application in providing barriers against chemical processes, such as dissolution, diffusion, oxidation, and corrosion. Additionally, hard coatings are available for mechanical protection. Immediate commercial uses for the invention include semiconductor and technical optics, or any other area requiring metal film deposition.

In microelectronics, many advancements can be achieved using the present invention. Ultra-thin layer deposition, multi-layer quantum-well structures, and magnetic superstructures are all amenable to production by the inventive techniques. For applications in micro-circuitry, height of deposition can be controlled relative to the width of contacts. Deposition of semiconductor materials such as Si and GaAs, is simple and direct. The inventive technology is extremely effective for the simultaneous deposition of different materials which can be intermixed or applied sequentially in multi-layers. The interface between the layers can be precisely manipulated, and refractory metals are easily deposited. The plasma plume is of low contaminant level, and sealed operation also limits contaminants dramatically in this contaminant sensitive production area.

Concerning microelectronics applications, it is very useful to highly dope the sacrificial cathode in the case, for example, of silicon in order to obtain a quality product.

Many other applications of the present invention are also available. The inventive miniature plasma gun is very useful in research and development efforts. Metals and other materials can be mixed during depositions, and hard metals can be deposited directly. Expensive source materials will last much longer using the present invention.

The present invention is also useful in production environments for the formation of multi-layer metallic and electrically conductive thin films for electronic device fabrication, optical coatings, X-ray optical devices, and magnetic recording material. Special applications of the present invention are in electrical property modification and catalysis.

Simplified Design

One important aspect of the present invention is the discovery by the inventors that many components of standard electric arc vapor deposition apparatuses can be eliminated without destroying the function of the apparatus. The inventive concepts and designs recited herein are required before the possibility of miniaturization could even be considered. The resulting apparatus bears little resemblance to prior art apparatuses in its size, components, and configuration, as well as the final product which can be produced.

The apparatus described in Bergman (U.S. Pat. No. 4,630,913, issued Nov. 4th, 1986) is typical of prior art vapor deposition apparatuses well known in the material sciences art. It is incapable of miniaturization due to its multiple mandatory components. The use of such prior art apparatuses was limited to the production of thick, relatively low quality films, that is films which are above a $\mu$ in thickness or, at least above several hundred Å in thickness.

The Bergman and other prior art arc vapor deposition apparatuses were run on a direct current, which provided for continuous function. Multiple, continuous cooling components were required because of this mode of operation. The triggering method was relatively slow, which well fitted the function of this apparatus. The shape of the anode was that of a thin cylindrical loop, with the cathode in the form of a squat cylinder.

The present invention is based on an ion source unfamiliar to practitioners in the materials science art. The ion source of the present invention is used by researchers involved with the analysis of subatomic and subnuclear particles, as in the use of an accelerator to produce ion bombardment of a chemical sample. The application of the technology of this divergent subject matter to the requirements of thin film production was accomplished by the inventors in a new and unexpected manner.

The inventors have developed for use in this dissimilar art a simplified ion source. The ion source described in a Brown et al patent (U.S. Pat. No. 4,785,220, granted Nov. 15th, 1988) is an example of ion-beam type vapor arc apparatuses including a relatively large component for ion extraction. A plasma plume is produced, and ions are extracted from it in order to produced an ion beam. As can be seen from the field of search and classification of claims in the Brown '220 and Bergman patents, the U.S. patent office finds no overlap in these disparate subject matters.

The present invention achieves a totally different function than either of the Brown or Bergman art apparatuses. It is capable of producing high quality thin film layers in the range of less than an Å to $\mu$ in thickness. The simplicity of this inventive plasma gun drastically reduces the cost of vacuum arc plasma deposition, and allows sequential layering of material.

The simplicity of the present inventive plasma guns and attendant apparatus components allows for the first time a dramatic miniaturization of vacuum arc plasma technology. Using this, method, finely controlled multiple layers of dissimilar material can be achieved. This can be accomplished without breaking the vacuum to refit the sacrificial cathode as would have been required in the prior art. The inventive apparatus allows the production of completely new materials.

Pulsed Mode Operation Operation in a pulsed mode permits control of the film deposition to within a tenth of a monolayer, or much less by appropriate choice of geometry. The synthesis of films of monolayer or sub-monolayer thickness is simple with the inventive plasma guns, and can be accomplished in a matter of minutes or less. Films of thicknesses of a few tenths of a $\mu$ can also be formed.

The plasma gun operates well with nearly all metallic elements of the periodic table. Therefore, the present invention allows the synthesis of thin films and multilayers of any conductive materials or any combination of such materials. Pure metals, alloys, chemical compounds, and some semiconductors can be employed. In experiments conducted by the inventors, stainless steel, brass, FeS, PbS, TiN, SiC, WC, UC, Si and C have been effectively employed. Titanium cobalt, yttrium, tungsten, molybdenum, silicon, platinum, and palladium can also be used.

Film Adhesion

Because of the directed energy of the plasma stream of the present invention (typically several tens of electron volts), film adhesion to the substrate and adhesion of interleaving multilayers to each other is excellent. Special opportunities are available because the deposition flux is pulsed and the timing of the plasma pulses can be controlled to the microsecond level. For example, highly reactive films can be deposited and immediately covered with another film allowing unique materials to be manufactured.

Multiple Gun Use

One feature of the present invention is that multiple plasma guns can operate simultaneously. As a result, multiple layers of different material can be laid down without requiring the release of the vacuum, realignment, and switching of the cathode material. This allows for the practical production of different material multilayers. It is also possible to form novel non-equilibrium materials using the inventive apparatus.

The present device allows the formation of multilayers which could be composed of 10 or more different metal or other material species in a single batch. In one aspect of the inventive thin film synthesis apparatus, the device can include 10 or more cathode containing plasma guns and a rotating plasma gun holder. In actual practice, the inventors were able to make high-Z/low-Z multilayer structures and Y-Ba-Cu structures with each layer from a few Ås to several tenths of a $\mu$.

Cathode Spot Formation

The fundamental phenomenon which drives the vacuum arc is that of cathode spot formation. These are minute regions of intense current concentration which reside on the surface of the cathode. At these points, the solid cathode material is vaporized, ionized, and injected into the inter electrode arc region. The current density at the cathode spots is of the order of $10^6$ A/cm$^2$ over a spot size of order microns. A typical vacuum arc discharge might consist of from one to many dozens of such spots. Much of the vapor arc discharge art is described by Lafferty ("Vacuum Arcs, Theory and Application", Lafferty Ed, Wiley, N.Y., 1980) and is herein incorporated into this application by reference.

Plasma Flux

In the inventive method, a miniature vacuum arc plasma source is used to generate an intense flux of plasma in a vacuum environment. The dense plasma plumes away from the cathode at which it is created through a central hole in an annular anode, and towards the substrate on which the film is to be formed. The plasma source is repetitively pulsed. This allows a thin film of conductive material to be deposited over an area of several square centimeters in a time of several minutes.

The properties of the plasma generated by inventive plasma gun have been extensively studied by the inventors as part of the Lawrence Berkeley Laboratory's MEVVA ion source research and development program. This source works well with virtually all solid metals of the periodic table as well as many other conductive materials. The source has been operated and the ion charge state distributions measured using 50 different metallic elements and a range of alloys and compounds.

The present invention allows other unique advantages as well. Because the deposition flux is in the plasma state, and contains multiply charged and highly excited ions, it is possible to produce novel chemistry effects.

Macroscopic Droplet Contamination

Along with the plasma that is generated by the present invention, in some cases there is also a flux of macroscopic droplets. These are typically in the size range of 0.1–10 microns. The inventors have examined the films prepared under SEM and have found a small but real "macroparticle" contamination on some of the films surfaces.

The origin of these particles appears to be at the cathode spot, and may result from the intense heating of the cathode material beneath the spot. A volume of material is rendered molten by the arc and the pressure gradient in the vicinity of the arc expels molten droplets along with the vapor.

The volume of molten material formed is less for higher melting point materials. The macro-particle contamination is observed to be less for cathode materials of higher melting points. When this contamination is a possibility, for some applications, useful films can be made by proper selection of the cathode material.

In the case of certain elements and compounds, such as a carbon cathode, even larger solid particles can be ejected from the arc spot. These appear to result from the porous nature of most solid carbon materials. Gas trapped in voids in the cathode causes pressure gradients which blow solid pieces of cathode from the source.

There is a natural separation of the wanted plasma flux from the unwanted macro-particle flux because the plasma flux is peaked in the direction normal to the cathode surface. By contrast, the macro-particle flux is peaked in a direction close to parallel to the cathode surface.

For those applications for which the macro-particle generation is severe or for which absolutely particle-free films are required, a magnetic filter can be used. This has been described by several researchers, and these articles are incorporated herein by reference into this patent applications (Aksenov, et al, *Soviet Journal of Plasma Physics*, 4(4), 4225, 1978; Voitzenya, et al, *Soviet Physics-Technological Physics*, 9(2), 221, 1964; Aksenov, et al, *Plasma Physics and Controlled Fusion*, 28, 761, 1986; Storer et al, *Journal of Applied Physics*, 66, 5245, 1989). Using this technique, there is an overall lose of plasma though the filter and a consequent decrease in deposition rate at the other end.

DETAILED DESCRIPTION OF THE INVENTION

In one embodiment of the present invention, the arc discharge is driven by a simple L-C pulse line of impedance 1 Ohm and pulse length 250 microseconds. The line is charged to a voltage of up to several hundred volts with a small dc power supply. A high voltage pulse applied to a trigger electrode initiates a surface spark discharge between the coaxial trigger electrode and the central cathode, which in turn causes the main anode-cathode circuit to close due to the spark plasma. The vacuum arc then proceeds. Typically, the source is operated at a repetition rate of up to several pulses per second. In some cases, this rate may be limited by heat removal considerations.

Figure 2:
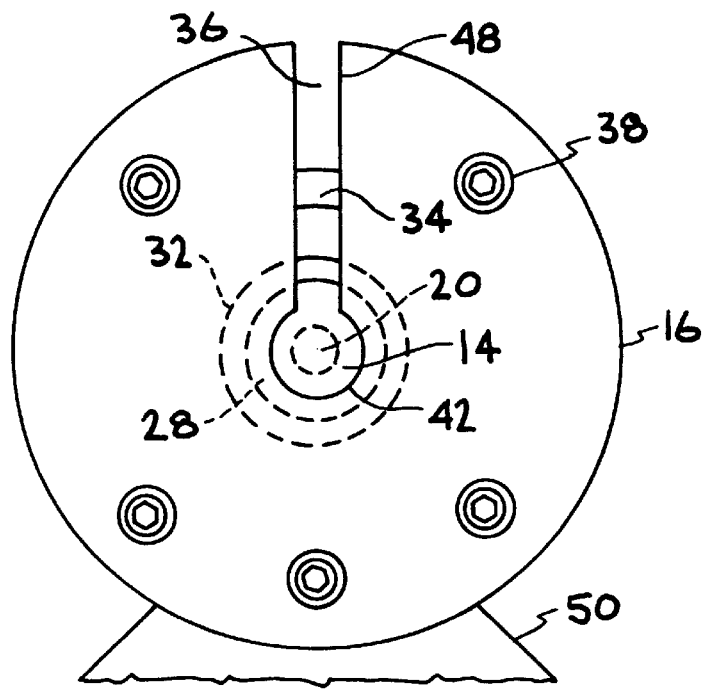
FIG. 2 is an enlarged end view of the device of the present invention taken along line 2—2 of FIG. 1 and further illustrating a portion of the support structure in phantom.
Figure 3:
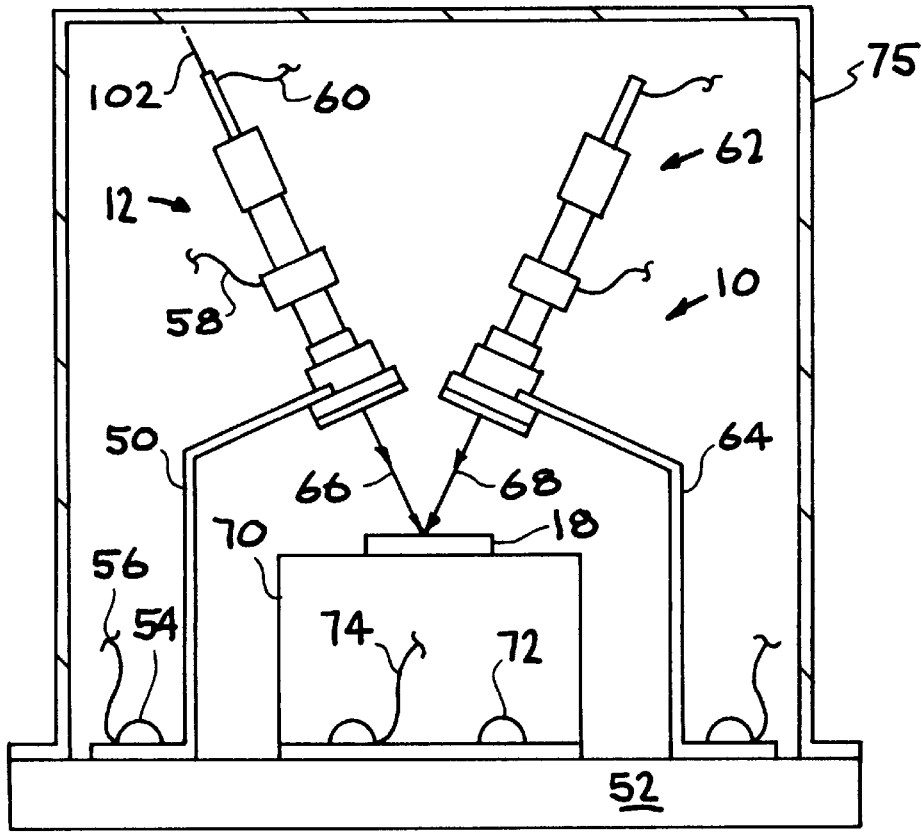
FIG. 3 is a front elevation view of an embodiment of the present invention using outlined multiple plasma beam generator units.

The invention as a whole is depicted in the drawings by reference character 10, FIG. 3. The plasma generator 10 includes as one of its elements a plasma source or unit 12. Unit FIGS. 1–2 is provided with a cathode 14 which is spaced from an anode 16. Cathode 14 is typically composed of the metallic material which is to be deposited on substrate 18, FIG. 3, which will be described in detail hereinafter. For example, cathode may be a metallic element such as cobalt, yttrium. Suffice it to say, cathode 14 may also be composed of a metallic compound or alloy as long as such composition is electrically conductive. Rod 20 threads into cathode 14 and is held to connector block 22 by set screw 24. Connector 26 threads into connector block 22 and serves as the terminus for negative electrical biasing of cathode 14. Insulator tube 28, which may be formed of alumina, fits over cathode 14. It should be noted that cathode 14 and rod 20 slip in and out of insulator tube 28 to facilitate the replacement of cathode 14. Tube 28 also fits within cavity 30 of connector block 22. Trigger electrode 32 is formed generally concentrically relative to insulator tube 28 and cathode 14, FIG. 2. Insulator bushing 34 and conductive support collar 36 complete the formation of plasma source unit 12. Support collar 36 serves as a base for the mounting of anode 16 by the way of plurality of set screws 38. It should be noted that anode 16, collar 36, trigger electrode 32, and rod 20 may be formed of stainless steel or other similar material.

Cavity 40 is formed by cathode 14, anode 16, and insulator bushing 34. The plasma generated by unit 12 forms within cavity 40 before passing through orifice 42 of anode 16. Electrical fitting 43 serves as the electrical terminal for trigger electrode 32.

With further reference to FIG. 1, means 44 for applying a magnetic field to any plasma beam or stream emanating from orifice 42, is also included. Means 44 is depicted as being several turns of 46 of insulative metallic wire. Turns 46 lie on the exterior of collar 36. Slot 48, FIG. 2, on anode 16 permits the magnetic field generated by means 44 to enter the plasma region within cavity 40.

Referring now to FIGS. 1–3, it may be observed that plasma source unit 12 is mounted on a support 50. Support 50 is electrically conductive and serves as an electrical conduit for the potential placed on anode 16 through conductive collar 36. Support 50 is fastened to insulative base block 52 by the use of fastener 54 which also serves as a terminal for electrical conduit 56. Conduit 58 feeds trigger electrode 32 while conduit 60 electrically connects to rod 20 of cathode 14. A second plasma source unit 62 is also shown in FIG. 3 as being supported to base block 52 by electrically conductive support 64. Plasma source unit 62 is essentially the same as plasma source unit 12, except that the cathode of plasma source unit 62 could be of different metallic material, the function of which will be described hereinafter. FIG. 3 also illustrates plasma streams 66 and 68 passing from plasma source units 12 and 62, respectively, and onto substrate 18. Z-shaped electrically conductive support 70 also fixes to base block 52 by plurality of fasteners 72. Electrical conduit 74 may also be connected to one of plurality of fasteners 72 to permit biasing of substrate 18. A vacuum enclosure 75 envelopes plasma source units 12 and 62, as well as substrate 18 during operation of plasma generator 10.

Figure 4:
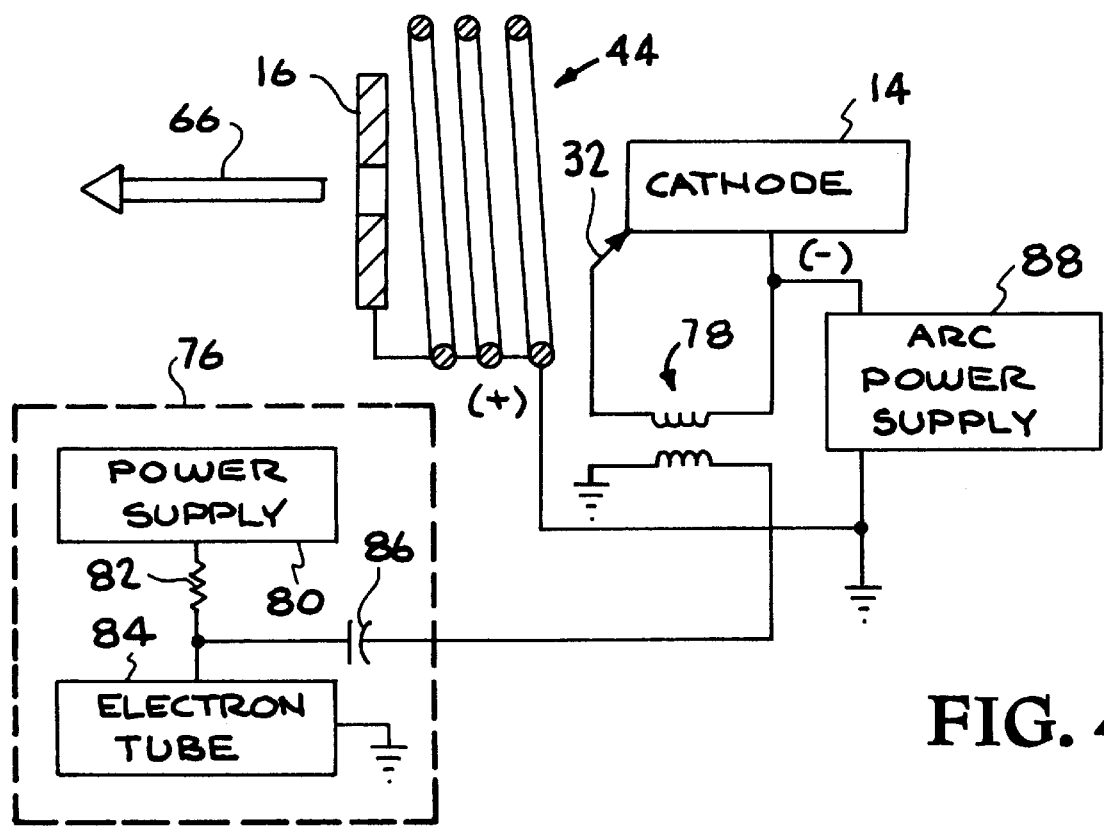
FIG. 4 is a schematic view of the electrical system employed to pulse the plused beam generator units of the present invention.

With reference to FIG. 4, an electrical schematic is represented depicting the firing circuit for trigger electrode 32. A trigger pulse generator 76 feeds pulse transformer 78.

Trigger pulse generator 76 may include power supply 80, resistor 82, electron tube 84, capacitor 86, feeding a pulsed power supply to trigger electrode 32. The metal vapor vacuum arc between cathode 14 and anode 16 is thereby caused to discharge from arc power supply 88. It should be noted that the arc current to anode 16, also flows through means 44, resulting in a pulsed magnetic field.

Figure 7:
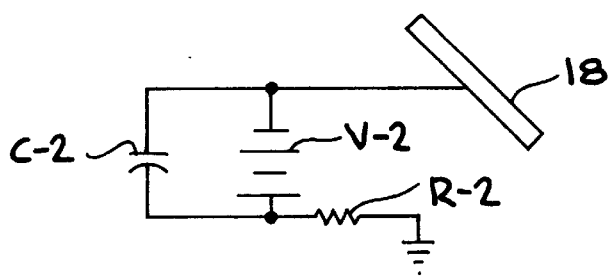
FIG. 7 is a schematic view of the electrical biasing of the substrate used in the present invention.

Turning to FIG. 7 it may be observed that substrate 18 may also be biased by DC power supply V-2 and parallel capacitor C-2. Resistor R-2 senses the current delivered to the substrate 18.

In operation, plasma source unit is assembled using a particular material for cathode 14 which is determinative of the material of the thin film to be placed on substrate 18. The trigger pulse line shown in FIG. 4 is then set as to the desired number of pulses per second and the arc current on trigger electrode 32. The amperage through resistor R-2 is also calculated. Comparison of the arc current through trigger electrode 32 and the plasma current to substrate 18 reveals the efficiency of the plasma generating system. For example, an efficiency of one percent would be acceptable in the embodiments shown in the drawings. The number of ions per shot or pulse (N) is then calculated using the following formula $$N/\text{shot} = \frac{I\,tau}{e\,\overline{Q}}$$

where I=bias current on substrate 18, tau=pulse length, e=electron charge, Q=the mean charge state of an ion of cathodic material. The number of atoms per cubic centimeter (N) is then calculated utilizing the following formula:

$$N/cc = \frac{D}{A(1.6 \times 10^{-24})}$$

where D is the density of the cathodic material, and A is the atomic weight of one atom of cathodic material. The term, $N^{2/3}$ equals the number of atoms per $cm^2$ for one monolayer of cathodic material. Thus, the thickness of one shot or pulse of plasma exiting plasma generator unit 12 may be determined. By counting the number of pulses or shots, a particular thickness or number of monolayers may be predetermined. With further reference to FIG. 3, plasma generator units 12 and 62 may be alternated to produce multiple layers on substrate 18. Controlling the duration of the succession of pulses from either plasma source unit 12 or 62 will also result in successive layers or films on substrate 18 of predetermined thicknesses.

Figure 5:
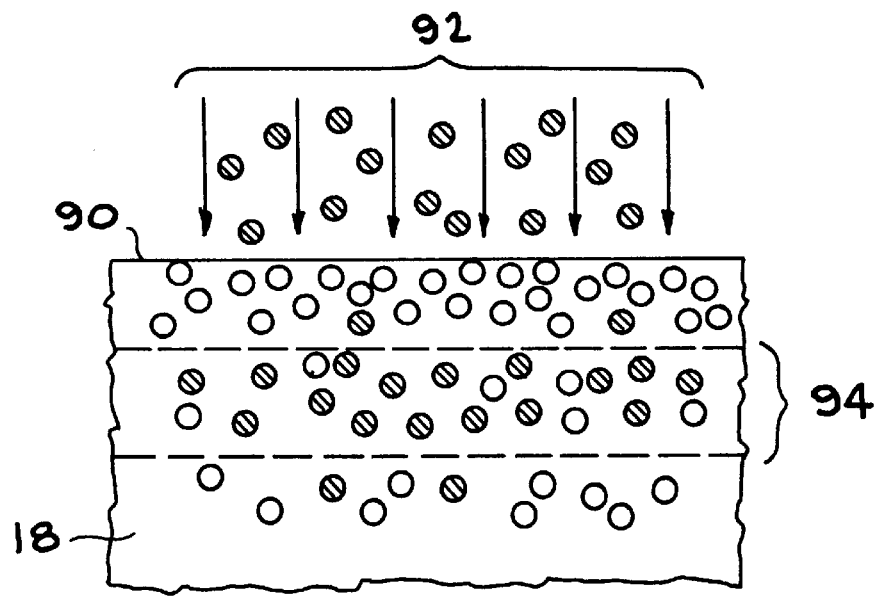
FIG. 5 is a schematic view of prior art implantation of ions into a substrate.

With reference to FIG. 5, substrate 18 is depicted as having a surface 90. High energy plasma ions 92 (shaded circle) are shown as being implanted within substrate 18. Such a result derives from the prior art implantation device noted previously. It should be noted that the ions implanted within substrate 18 are normally found in a zone 94 generally between 0.1 and 1.0 microns below surface 90 of substrate 18.

Figure 6:
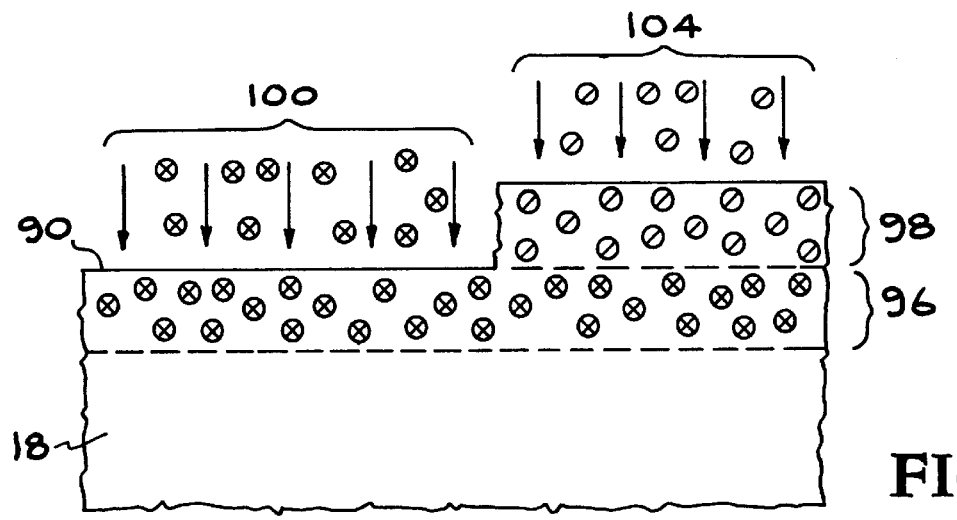
FIG. 6 is a schematic view of the formation of single or multiple thin film layers on a substrate.

Turning now to FIG. 6, the result obtained by the present invention is shown where the production of a film or layer 96 takes place on surface 90 of substrate 18 utilizing ions 100 of plasma stream 66 ("x" within circle). The thickness of film 96 is determined by regulating the number of pulses or shots of the plasma stream 66 sent through opening or orifice 42 of anode 16. It should be mentioned that plasma stream 66 is directed onto substrate 18 by aligning axis 102 of unit 12 and cathode 14 with the surface of substrate 18. The transverse dimension of ion stream 66 may also be regulated by the size of orifice 42 of anode 16. In other words, the spread of plasma stream 66 may be widened or narrowed by widening or narrowing orifice 42 of anode 16. FIG. 6 also depicts a second layer 98 placed atop layer 96 by utilizing ions 104 (slant line within circle) originating from plasma stream 68 of unit 62 illustrated in FIG. 3. Of course, layer 98 may also be produced by unit 12 after simply changing cathode 14, therewithin, to a different material.

In the processes depicted in FIG. 6, it should be understood that the ions 100, and 104, gain electrons from substrate 18 to form the atoms of a layer atop surface 90 of substrate 18. For the sake of convenience, the symbols employed in FIG. 6 for such atoms are the same as the source ions shown therein.

The following is a table of components typically used in the circuits shown in FIGS. 4 and 7.

| ITEM | IDENT DATA | SOURCE |
| --- | --- | --- |
| Pulse Transformer 78 | TR 136 B | E.G.&G., Boston, MA. |
| Arc Power Supply 88 | Pulse & Digital Cir. Chpt. 10 Pages 291–304 (L-C pulse line) | Millinan and Taub McGraw Hill 1956 |
| Power Supply 80 | HV-1584R | Power Designs Co. Palo Alto, Ca. |
| Resistor 82 | 1 MOHM 10 Watt | Ohmite Co. Skokie, IL. |
| Electron tube 84 | 5C22 Thyratron | I.T.T. Easton, PA. |
| Capacitor 86 | 0.1 micro f, 15 kv | G.E. Schnectady, N.Y. |
| Capacitor C-2 | 10 micro f | G.E. Schnectady, N.Y. |
| Voltage Source V-2 | 25 V. DC Battery | Duracell Inc, Bethel, Ct. |
| Resistor R-2 | 1 ohm | Ohmite Co. Skokie, IL. |

In order to describe the invention more completely the following examples are given without intending to limit the invention to the specific examples set forth therein, except as such as they appear as limitations in the appended claims.

EXAMPLE I

The plasma source 12 of FIG. 1 was fitted with an yttrium cathode. The pulse line provided an arc current of 40 amps, for a pulse duration of 250 micro seconds. The silicon substrate 18 was biased to (−)25 volts D.C., FIG. 7, using a one ohm resistor R-2 and a 10 microfarad capacitor C-2. The vacuum on the plasma source and substrate was approximately $8\times10^{-7}$ Torr. Ascertaining the voltage across resistor R-2, the plasma ion current measured 0.3 amps. Thus, the efficiency of the system, comparing the plasma ion current to the arc current, was about 0.75%. Through time-of-flight diagnostics the mean charge state of the yttrium ions was measured as 2.4. The number of ions per shot or pulse was calculated as being $2.34\times10^{14}$. Using the yttrium specific gravity as 4.47, 1560 shots was calculated to equal a layer thickness of 1000 angstroms. The plasma source was run through 1560 shots. A layer of yttrium of about 980 angstroms deposited on the silicon substrate 18 (Some oxygen combined with yttrium in the deposited layer, resulting from the presence of oxygen within the vacuum chamber surrounding the plasma source and substrate). The thickness of the deposited yttrium layer was confirmed by Rutherford Backscattering Spectrometry (RBS). The film was found to be of high quality.

EXAMPLE II

Figure 8:
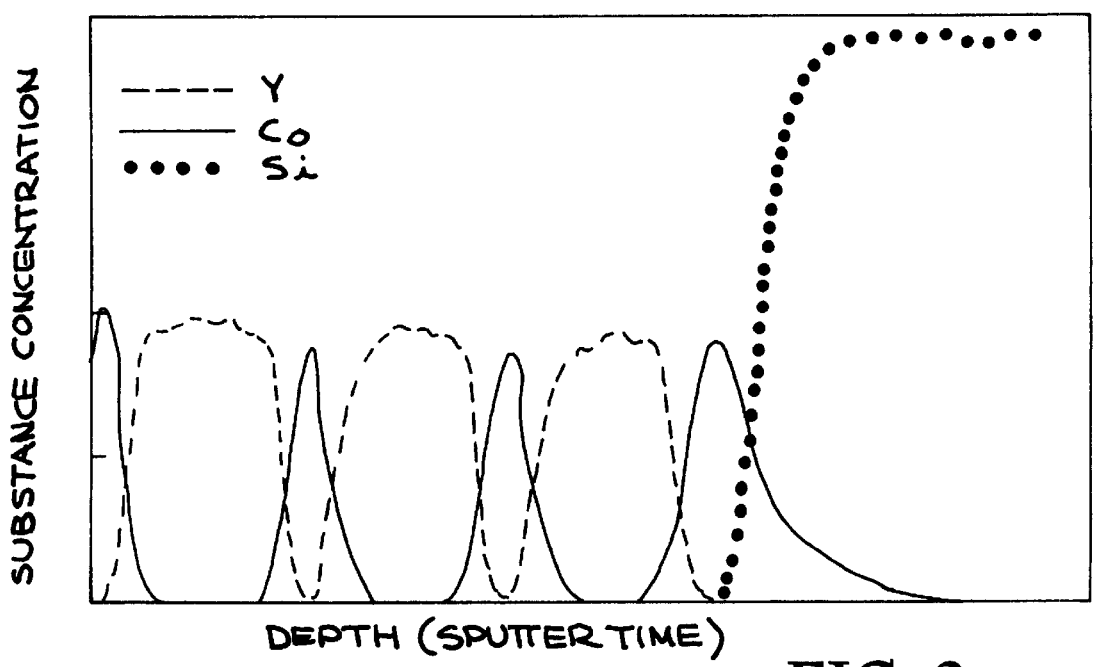
FIG. 8 is a graph of an experiment resulting in a multiple layer film of yttrium and cobalt on a silicon substrate, described in detail in EXAMPLE II hereinafter.

The plasma source shown in FIG. 3 was operated with an yttrium cathode in source unit 12 and a cobalt cathode in source 62. Under calculations similar to those of Example I and employing (30) amps of arc current, 1 pulse per second, and a vacuum of $1.5 \times 10^{-6}$ Torr, 250 shots of each source 12 and 62 were alternately applied to a silicon substrate, such as substrate 18. Thus, three layers of yttrium and four layers of cobalt, were alternately applied or interleaved. The thickness of each the cobalt layers and each of the yttrium layers were measured to be 45 angstroms and 200 angstroms, respectively. Such measurements were obtained by sputtering 1 KV argon ions in conjunction with Auger Electron Spectroscopy (AES), and are plotted on FIG. 8. Oxygen was also detected in the layers, primarily as yttrium oxide, due to the presence of oxygen within the vacuum chamber surrounding the plasma source units 12 and 62 substrate 18.

The miniature plasma gun has typical dimensions of about 1 mm to 10 cm diameter and 1 mm to 50 cm length; preferably about 5 mm to 2 cm diameter and 1 cm to 10 cm length; and more preferably about 1 cm diameter and 5 cm length. The gun is operated with pulses of typical duration of about 10 $\mu$s to 100 ms; preferably about 100 $\mu$s to 1 ms; and more preferably about 250 $\mu$s. The duty cycle is typically 10% or less. The arc current is typically about 10 A to 1000 A; preferably about 30 A to 200 A; and more preferably about 100 A. The gun is operated to produce a plasma flux of about $10^{17}$ to $10^{21}$ ions/second during a pulse; preferably about $10^{18}$ to $10^{20}$ ions/second; and more preferably about $10^{19}$ ions/seconds.

While in the foregoing embodiments of the present invention have been set forth in considerable detail for the purposes of making a complete disclosure of the invention, it may be apparent to those of skill in the art that numerous changes may be made in such detail without departing from the spirit and principles of the invention.

We claim:

1. A coating apparatus, comprising:
   a) one or more miniature pulsed vacuum arc plasma guns, each gun comprising a solid electrically conductive cathode, an annular anode, and a trigger electrode,
   b) an electrical pulser comprising a trigger pulse generator connected to the trigger electrode and an arc power supply connected between the cathode and anode for pulsing said one or more plasma guns to produce a plasma between the cathode and anode,
   c) a holder for supporting a target substrate or substrates to be coated with material from the cathode of each plasma fun so that the plasma formed by each plasma gun is directed onto a surface of the substrate or substrates,
   d) a vacuum chamber which envelops the one or more plasma guns and the holder.

2. The coating apparatus of claim 1, wherein the pulser pulses each plasma gun to produce an intense pulsed plasma flux in the range of about $10^{17}$ to $10^{21}$ ions/second during a pulse.

3. The coating apparatus of claim 1, wherein the pulser pulses each plasma gun to produce an intense pulsed plasma flux in the range of about $10^{18}$ to $10^{20}$ ions/second during a pulse.

4. The coating apparatus of claim 1, wherein the pulser pulses each plasma gun to produce an intense pulsed plasma flux in the range of about $10^{19}$ ions/second during a pulse.

5. The coating apparatus of claim 1, wherein each plasma gun is within the dimensions of about 1 mm–10 cm in diameter and 1 mm–50 cm in length.

6. The coating apparatus of claim 1, wherein each plasma gun is within the dimensions of about 5 mm–2 cm in diameter and 1 cm–10 cm in length.

7. The coating apparatus of claim 1, wherein each plasma gun is within the dimensions of about 1 cm in diameter and 5 cm in length.

8. The apparatus of claim 1 comprising more than one plasma gun, wherein the cathodes of each gun are made of different materials.

9. The apparatus of claim 1 wherein the trigger electrode is a coaxial electrode which is concentric around the cathode.

10. The apparatus of claim 9 further comprising an insulator tube surrounding the cathode and separating the cathode from the coaxial trigger electrode.

11. The apparatus of claim 1 further comprising a bias source for negatively biasing a target substrate while being coated.

12. The apparatus of claim 1, where the cathodic materials are metal or metal alloy.

13. The apparatus of claim 1, wherein the cathodic material is selected from the group of titanium, cobalt, yttrium, tungsten, molybdenum, silicon, stainless steel, brass, FeS, PbS, TiN, SiC, WC, UC, C, Pt, and Pd.

14. A process of producing adherent layers of from below about 1 Å to about 1$\mu$ in thickness using a coating apparatus comprising i) one or more miniature pulsed vacuum arc plasma guns, each gun comprising a solid electrically conductive cathode, an annular anode, and a trigger electrode, ii) an electrical pulser comprising a trigger pulse generator connected to the trigger electrode and an arc power supply connected between the cathode and anode for pulsing said one or more plasma guns to produce a plasma between the cathode and anode, iii) a holder for supporting a target substrate or substrates to be coated with material from the cathode of each plasma gun so that the plasma formed by each plasma gun is directed onto a surface of the substrate or substrates, iv) a vacuum chamber which envelops the one or more plasma guns and the holder, the process comprising:
   a. positioning a target in the holder,
   b. evacuating said vacuum chamber of air,
   c. charging said electrical pulser, and
   d. pulsing said trigger electrode of each plasma gun to discharge the arc power supply between the cathode and anode to produce a plasma between the cathode and anode of each plasma gun which is directed onto a surface of the target,
   e. continuing to pulse each plasma gun until a layer of desired thickness is formed on the target.

15. The process of claim 14 wherein duration of pulsing of step (d) is from about 10$\mu$seconds to 100 milliseconds.

16. The process of claim 15 wherein duration of pulsing of step (d) is from about 100$\mu$seconds to 1 milliseconds.

17. The process of claim 15 wherein duration of pulsing of step (d) is about 250$\mu$seconds.

18. The process of claim 14, wherein pulsing of step (d) has a duty cycle of 10% or less.

19. The process of claim 14, wherein the arc power supply is discharged at between about 10–1,000 A.

20. The process of claim 19, wherein the arc power supply is discharged at between about 30–200 A.

21. The process of claim 20, wherein the arc power supply is discharged at about 100 A.

22. The process of claim 14, further comprising negatively biasing the target while being coated.

23. A metallic thin film firmly adherent to a substrate produced by a process using a coating apparatus comprising i) one or more miniature pulsed vacuum arc plasma guns, each gun comprising a solid electrically conductive cathode, an annular anode, and a trigger electrode, ii) an electrical pulser comprising a trigger pulse generator connected to the trigger electrode and an arc power supply connected between the cathode and anode for pulsing said one or more plasma guns to produce a plasma between the cathode and anode, iii) a holder for supporting a target substrate or substrates to be coated with material from the cathode of each plasma gun so that the plasma formed by each plasma gun is directed onto a surface of the substrate or substrates, iv) a vacuum chamber which envelops the one or more plasma guns and the holder, the process comprising:

a. positioning a target in the holder,
b. evacuating said vacuum chamber of air,
c. charging said electrical pulser,
d. pulsing said trigger electrode of each plasma gun to discharge the arc power supply between the cathode and anode to produce a plasma between the cathode and anode of each plasma gun which is directed onto a surface of the target,
e. continuing to pulse each plasma gun until a layer of desired thickness is formed on the target, said film having a thickness ranging from less than 1 A to $1\mu A$.

* * * * *